US012592278B2

(12) United States Patent
Sakui et al.

(10) Patent No.: US 12,592,278 B2
(45) Date of Patent: Mar. 31, 2026

(54) MEMORY DEVICE USING SEMICONDUCTOR ELEMENT

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 161 days.

(21) Appl. No.: 18/763,776

(22) Filed: Jul. 3, 2024

(65) Prior Publication Data

US 2025/0014636 A1     Jan. 9, 2025

(30) Foreign Application Priority Data

Jul. 7, 2023     (WO) .................. PCT/JP2023/025322

(51) Int. Cl.
| | |
|---|---|
| *G11C 11/4096* | (2006.01) |
| *G11C 11/4097* | (2006.01) |
| *H10B 12/00* | (2023.01) |

(52) U.S. Cl.
CPC ...... *G11C 11/4096* (2013.01); *G11C 11/4097* (2013.01); *H10B 12/20* (2023.02)

(58) Field of Classification Search
CPC .. G11C 11/4096; G11C 11/4097; H10B 12/20
USPC .................................................. 365/189.011
See application file for complete search history.

(56) References Cited

U.S. PATENT DOCUMENTS

| | | | | |
|---|---|---|---|---|
| 11,569,256 | B2 * | 1/2023 | Naruke .................. | G11C 16/26 |
| 2003/0111681 | A1 | 6/2003 | Kawanaka | |
| 2006/0157738 | A1 | 7/2006 | Kawanaka | |
| 2007/0297232 | A1 | 12/2007 | Iwata | |
| 2008/0137394 | A1 | 6/2008 | Shimano et al. | |
| 2009/0290402 | A1 * | 11/2009 | Song ........................ | G11C 8/14 |
| | | | | 365/207 |
| 2013/0194871 | A1 | 8/2013 | Lin et al. | |
| 2022/0367473 | A1 | 11/2022 | Sakui et al. | |
| 2022/0367681 | A1 | 11/2022 | Harada et al. | |

(Continued)

FOREIGN PATENT DOCUMENTS

| | | |
|---|---|---|
| JP | H02188966 A | 7/1990 |
| JP | H03171768 A | 7/1991 |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991) (6 pages).

(Continued)

*Primary Examiner* — Huan Hoang
(74) *Attorney, Agent, or Firm* — Crowell & Moring LLP

(57) ABSTRACT

A first block in which a plurality of dynamic flash memory cells are arrange in a matrix shape on a substrate includes a first dynamic flash memory cell and a second dynamic flash memory cell. A second block disposed relative to the first block in a perpendicular direction or a parallel direction of the substrate includes a third dynamic flash memory cell and a fourth dynamic flash memory cell. Thus, dynamic flash memory cells are formed.

14 Claims, 10 Drawing Sheets

(56)                    References Cited

U.S. PATENT DOCUMENTS

2023/0106561 A1    4/2023    Hsu
2023/0186966 A1    6/2023    Shirota et al.

FOREIGN PATENT DOCUMENTS

JP    2003-188279 A    7/2003
JP    2008-004765      1/2008
JP    2008-147514      6/2008
JP    2013-157074      8/2013
JP        7057032      4/2022

OTHER PUBLICATIONS

H. Chung, H. Kim, H. Kim, K. Kim, S. Kim, K. W.Song, J. Kim, Y.C. Oh, Y. Hwang, H. Hong, G. Jin, and C. Chung: "Novel 4F2 DRAM Cell with Vertical Pillar Transistor(VPT)," 2011 Proceeding of the European Solid-State Device Research Conference, (2011) (4 pages).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, 992201-2227 (2010) (27 pages).

K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007) (4 gages).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015) (9 pages).

M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electron," IEEE Electron Device Letter, vol. 31, No. 5, pp. 405-407 (2010) (3 pages).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, 99179-181 (2012) (3 pages).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32mm Node and Beyond," IEEE IEDM (2006). (4 pages).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697,Apr. 2006. (6 pages).

F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI,"IEICE Trans. Electron, vol. E90-c., No. 4 pp. 765-771 (2007) (7 pages).

K.Sakui, N. Harada," Dynamic Flash Memory with Dual Gate Surrounding Gate Transistor gSGT,"Proc. IEEE IMW, pp. 72-75(2021) (2 pages).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002). (13 pages).

K. Sakui, Y. Li, M. Kakumu, K. Kanazawa, I. Kunishima, Y. Iwata, and N. Harada, "Design Impact on Three Gate Dynamic Flash Memory (SG_DFM) for Long Hole Retention Time and Robust Disturbance Shield," in Memories—Materials, Devices, Circuits and Systems, Elsevier, 4, 100054, pp. 1-5, May 2023. (5 pages).

W.-C. Chen, H.-T. Lue, M.-Y. Wu, T.-H. Yeh, P.-Y. Du, T.-H. Hsu, C.-C. Hsieh, K.-C. Wang, and C.-Y. Lu, "A 3D Stackable DRAM: Capacitor-less Three-Wordline Gate-Controlled Thyristor (GCT) RAM with >40µA Current Sensing Window, >1010 Endurance, and 3-second Retention at Room Temperature," in IEEE IEDM (International Electron Devices Meeting), pp. 607-610, Dec. 2022. (4 pages).

W.-C. Chen, H.-T. Lue, T.-H. Hsu, K.-C. Wang, and C.-Y. Lu, "A Simulation Study of Scaling Capability toward 10nm for the 3D Stackable Gate-Controlled Thyristor (GCT) DRAM Device," in IEEE IMW (International Memory Workshop), pp. 25-28, Ma 2023. (4 pages).

M. Huang, S. Si, Z. He, Y. Zhou, S. Li, H. Wang, J. Liu, D. Xie, M. Yang, K. You, C. Choi, Y. Tang, X. Li, S. Qian, X. Yang, L. Hou, W. Bai, Z. Liu, Y. Tang, Q. Wu, Y. Wang, T. Dou, J. Kim, G.-L. Wang, J. Bai, A. Takao, C. Zhao, A. Yoo, M. Zhou, "A 3D Stackable 1TtC DRAM: Architecture, Process Integration and Circuit Simulation," in IEEE IMW (International Memory Workshop), pp. 29-32, May 2023. (4 pages).

J.W. Han, S.H. Park, M.Y. Jeong, K.S. Lee, K.N. Kim, H.J. Kim, J.C. Shin, S.M. Park, S.H. Shin, S.W. Park, KS. Lee, J.H. Lee, SH. Kim, B.C Kim, M.H. Jung, I.Y. Yoon, H. Kim, S.U. Jang, K.J. Park, Y.K. Kim, I.G. Kim, J.H Oh, S.Y. Han, B.S. Kim, B.J. Kuh, and J.M. Park, "Ongoing Evolution of DRAM Scaling via Third Dimension-Vertically Stacked DRAM" in 2023 Symposium on VLSI Technology and Circuits Digest of Technical Pagers, TFS1-1, pp. 1-2, Jun. 2023. (2 pages).

K. Sakui, and N. Harada, "Read Non-Destructive Dynamic Flash Memory (DFM) with Dual and Double Gates," Extended Abstracts of the 2022 International Conference on Solid State Devices and Materials, pp. 405-406, Sep. 2022. (2 pages).

International Search Report and Written Opinion in Japanese Application No. PCT/JP2023/025322, dated Sep. 13, 2023 (7 pages).

International Search Report and Written Opinion in International Application No. PCT/JP2023/025322, dated Sep. 13, 2023 (English and Japanese Languages) (12 pages).

* cited by examiner

MEMORY DEVICE USING SEMICONDUCTOR ELEMENT

CROSS-REFERENCE TO RELATED APPLICATIONS

This application claims priority to PCT/JP2023/025322, filed Jul. 7, 2023, the entire content of which is incorporated herein by reference.

BACKGROUND OF THE INVENTION

1. Field of the Invention

The present invention relates to a memory device using a semiconductor element.

2. Description of the Related Art

Today, in technical development of large scale integration (LSI), there is a demand for higher integration, higher performance, lower power consumption, and higher functions of memory elements.

The integration of the memory elements is being increased and the performance of the memory elements is being improved. There are, for example, the following memory elements: a dynamic random access memory (DRAM) that uses a surrounding gate transistor (SGT) as a selection transistor to which a capacitor is connected (for the SGT, see Japanese Unexamined Patent Application Publication No. 2-188966, and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991); for the DRAM, see, for example, H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)); a phase change memory (PCM) to which a resistance change element is connected (see, for example, H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No 12, December, pp. 2201-2227 (2010)); a resistive random access memory (RRAM, see, for example, K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "LOW Power and high Speed Switching of Ti-doped NiO ReRAM under the Unipolar Voltage Source of less than 3V", IEDM (2007)); and a magneto-resistive random access memory (MRAM) that changes the resistance by changing the direction of magnetic spin with a current (see, for example, W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)).

There also is a capacitorless DRAM cell including a single metal oxide semiconductor (MOS) transistor or the like (see Japanese Unexamined Patent Application Publication No. 3-171768, M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010), J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida: "A Capacitorless 1T-DRAM Technology Using Gate-Induced Drain-Leakage (GIDL) Current for Low-Power and High-Speed Embedded Memory", IEEE IEDM (2006)). In the DRAM cell including a single MOS transistor, for example, part or the entirety of a positive hole group out of the positive hole group and an electron group generated in a channel by impact ionization due to a current between a source and a drain of an N-channel MOS transistor is held in the channel to write logical storage data "1". Logical storage data "0" is written by discharging the positive hole group from the channel. As memory cells, the memory cell for writing "1" and the memory cell for writing "0" are randomly provided with a shared selection word line. When an ON voltage is applied to the selection word line, a floating body channel voltage of the selection memory cell continuous with this selection word line significantly fluctuates due to capacitive coupling between the gate electrode and the channel. Regarding this memory cell, the following tasks arise: suppressing reduction of an operation margin due to voltage fluctuation of the floating body channel; and reduction of degradation of data retention due to discharging of part of the positive hole group serving as signal charges stored in the channel.

There also is a twin-transistor MOS memory element in which a single memory cell is formed by using two MOS transistors in a silicon on insulator (SOI) layer (see, for example, U.S. Patent Application Publication No. 2008/0137394 A1, U.S. Patent Application Publication No. 2003/0111681 A1, and F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI", IEICE Trans. Electron., Vol. E90-c., No. 4 pp. 765-771 (2007)). In these elements, an $N^+$ layer serving as a source or a drain that separates floating body channels of the two MOS transistors is formed so as to be in contact with an insulating layer provided on the substrate side. With this $N^+$ layer, the floating body channels of two MOS transistors are electrically isolated. A positive hole group serving as signal charges is stored only in the floating body channel of one of the MOS transistors. The other MOS transistor serves as a switch for reading the positive hole group of the signal stored in the one of the MOS transistors. Also in this memory cell, since the positive hole group serving as the signal charges is stored in the channel of a single MOS transistor, the following task arises as is the case with the memory cell including a single MOS transistor: suppressing reduction of the operation margin; or reduction of degradation of the data retention due to discharging of part of the positive hole group serving as the signal charges stored in the channel.

There also is a capacitorless dynamic flash memory cell 111 illustrated in FIGS. 3A to 3D that includes a MOS transistor (see Japanese Patent No. 7057032 and K. Sakui, and N. Harada, "Dynamic Flash Memory with Dual Gate Surrounding Gate Transistor (SGT)", Proc. IEEE IMW, pp.

72-75 (2021)). As illustrated in FIG. 3A, a floating body semiconductor base 102 is provided on an $SiO_2$ layer 101 of a SOI substrate. An $N^+$ layer 103 connected to a source line SL and an $N^+$ layer 104 connected to a bit line BL are respectively provided at one end and the other end of the floating body semiconductor base 102. A first gate insulating layer 109a and a second gate insulating layer 109b are also provided. The first gate insulating layer 109a is continuous with the $N^+$ layer 103 and covers the floating body semiconductor base 102. The second gate insulating layer 109b is continuous with the $N^+$ layer 104 and the first gate insulating layer 109a via a slit insulating film 110 and covers the floating body semiconductor base 102. Also, a first gate conductor layer 105a and a second gate conductor layer 105b are provided. The first gate conductor layer 105a covers the first gate insulating layer 109a and is continuous with a plate line PL. The second gate conductor layer 105b covers the second gate insulating layer 109b and is continuous with a word line WL. The slit insulating film 110 is provided between the first gate conductor layer 105a and the second gate conductor layer 105b. Thus, the memory cell 111 of a dynamic flash memory (DFM) is formed. The source line SL and the bit line BL may be respectively connected to the $N^+$ layer 104 and the $N^+$ layer 103.

As illustrated in FIG. 3A, for example, a zero voltage is applied to the $N^+$ layer 103 and a positive voltage is applied to the $N^+$ layer 104 so as to cause a first N-channel MOS transistor region including the floating body semiconductor base 102 covered with the first gate conductor layer 105a to operate in a saturation region and cause a second N-channel MOS transistor region including the floating body semiconductor base 102 covered with the second gate conductor layer 105b to operate in a linear region. As a result, no pinch-off point exists in the second N-channel MOS transistor region, and an inversion layer 107b is formed throughout a surface. The inversion layer 107b formed on the lower side of the second gate conductor layer 105b connected to the word line WL operates as a substantial drain of the first N-channel MOS transistor region. As a result, an electric field is maximized in a boundary region of the semiconductor base between the first N-channel MOS transistor region and the second N-channel MOS transistor region, thereby impact ionization is produced in this region. Then, as illustrated in FIG. 3B, an electron group out of the electron group and a positive hole group generated by impact ionization is discharged from the floating body semiconductor base 102, and part or the entirety of a positive hole group 106 is held in the floating body semiconductor base 102 so as to perform a memory write operation. This state is the logical storage data "1".

As illustrated in FIG. 3C, for example, an erase operation is performed by applying a positive voltage to the plate line PL, a zero voltage to the word line WL and the bit line BL, and a negative voltage to the source line SL so as to discharge the positive hole group 106 from the floating body semiconductor base 102. This state is the logical storage data "0". In data reading, a characteristic with which no current flows even when the voltage of the word line WL is increased in reading of the logical storage data "0" as illustrated in FIG. 3D can be obtained by setting a voltage applied to the first gate conductor layer 105a continuous with the plate line PL to be higher than a threshold voltage at the time of the logical storage data "1" and lower than a threshold voltage at the time of logical storage data "0". Due to this characteristic, the operation margin can be significantly increased compared to the case of the capacitorless DRAM cell including a single MOS transistor. In this memory cell, the channels of the first and second N-channel MOS transistor regions using, as the gates, the first gate conductor layer 105a continuous with the plate line PL and the second gate conductor layer 105b continuous with the word line WL are continuous with the floating body semiconductor base 102. Thus, voltage fluctuation of the floating body semiconductor base 102 occurring when a selection pulse voltage is applied to the word line WL is significantly suppressed. This greatly suppresses the reduction of the operation margin which arises the problem in the above-described memory cell or greatly reduces the problem of degradation of data retention due to discharging of part of the positive hole group serving as signal charges stored in the channel. From this time, further improvement of the characteristics is demanded of this memory element.

There also is a known capacitorless dynamic flash memory cell 8 illustrated in FIG. 4 that includes a MOS transistor and three gates (see U.S. Patent Application Publication No. 2023/0186966 A1 and K. Sakui, Y. Li, M. Kakumu, K. Kanazawa, I. Kunishima, Y. Iwata, and N. Harada, "Design Impact on Three Gate Dynamic Flash Memory (3G_DFM) for Long Hole Retention Time and Robust Disturbance Shield", in Memories-Materials, Devices, Circuits and Systems, Elsevier, 4, 100054, pp. 1-5, May 2023). A silicon semiconductor pillar (Si pillar) 2 is provided on a substrate 1. The Si pillar 2 includes an $N^+$ layer 3a, a P layer 7, and an $N^+$ layer 3b in this order from below. The P layer 7 between the $N^+$ layers 3a and 3b serves as a channel region 7a. A first gate insulating layer 4a, a second gate insulating layer 4b, and a third gate insulating layer 4c are provided in this order from below so as to surround a lower portion of the Si pillar 2. A first gate conductor layer 5a is provided so as to surround the first gate insulating layer 4a, a second gate conductor layer 5b is provided so as to surround the second gate insulating layer 4b, and a third gate conductor layer 5c is provided so as to surround the third gate insulating layer 4c. The first gate conductor layer 5a and the second gate conductor layer 5b are isolated from each other by an insulating layer 6a, and the second gate conductor layer 5b and the third gate conductor layer 5c are isolated from each other by an insulating layer 6b. Thus, the dynamic flash memory cell including the following layers are formed: the $N^+$ layers 3a and 3b, the P layer 7, the first gate insulating layer 4a, the second gate insulating layer 4b, and the third gate insulating layer 4c, the first gate conductor layer 5a, the second gate conductor layer 5b, and the third gate conductor layer 5c. As a feature of this structure, recombination of the positive hole group stored in the channel region 7a between the $N^+$ layers 3a and 3b is significantly suppressed in the $N^+$ layers 3a and 3b due to utilization of electrical shielding between the first gate conductor layer 5a and the third gate conductor layer 5c. As a result, the retention of the data "1" is significantly improved. The dynamic flash memory cells may be provided parallel to the substrate 1 so as to laminate a plurality of memory cells in the perpendicular direction. This can increase the degree of integration (see U.S. Patent Application Publication No. 2022/0367681 A1). The first gate conductor layer 5a, the second gate conductor layer 5b, and the third gate conductor layer 5c may be divided (see, for example, U.S. Patent Application Publication No. 2022/0367473 A1 and K. Sakui, and N. Harada, "Read Non-Destructive Dynamic Flash Memory (DFM) with Dual and Double Gates", Extended Abstracts of the 2022 International Conference on Solid State Devices and Materials, pp. 405-406, September 2022).

There also are publications of a capacitorless thyristor RAM including three gates (see W.-C. Chen, H.-T. Lue, M.-Y. Wu, T.-H. Yeh, P.-Y. Du, T.-H. Hsu, C.-C. Hsieh, K.-C. Wang, and C.-Y. Lu, "A 3D Stackable DRAM: Capacitor-less Three-Wordline Gate-Controlled Thyristor (GCT) RAM with >40 pA Current Sensing Window, >1010 Endurance, and 3-second Retention at Room Temperature", in IEEE IEDM (International Electron Devices Meeting), pp. 607-610, December 2022 and W.-C. Chen, H.-T. Lue, T.-H. Hsu, K.-C. Wang, and C.-Y. Lu, "A Simulation Study of Scaling Capability toward 10 nm for the 3D Stackable Gate-Controlled Thyristor (GCT) DRAM Device", in IEEE IMW (International Memory Workshop), pp. 25-28, May 2023). This thyristor memory has an advantage in that a plurality of layers can be laminated so as to reduce an equivalent memory size. However, since the thyristor is used as a reading mechanism, a reading current value is significantly increases and decreases. As a result, power consumption increases.

There also are publications of a 1TIC DRAM cell including a capacitor that can be laminated (see M. Huang, S. Si, Z. He, Y. Zhou, S. Li, H. Wang, J. Liu, D. Xie, M. Yang, K. You, C. Choi, Y. Tang, X. Li, S. Qian, X. Yang, L. Hou, W. Bai, Z. Liu, Y. Tang, Q. Wu, Y. Wang, T. Dou, J. Kim, G.-L. Wang, J. Bai, A. Takao, C. Zhao, A. Yoo, M. Zhou, "A 3D Stackable 1T1C DRAM: Architecture, Process Integration and Circuit Simulation", in IEEE IMW (International Memory Workshop), pp. 29-32, May 2023 and J. W. Han, S. H. Park, M. Y. Jeong, K. S. Lee, K. N. Kim, H. J. Kim, J. C. Shin, S. M. Park, S. H. Shin, S. W. Park, K. S. Lee, J. H. Lee, S. H. Kim, B. C Kim, M. H. Jung, I. Y. Yoon, H. Kim, S. U. Jang, K. J. Park, Y. K. Kim, I. G. Kim, J. H Oh, S. Y. Han, B. S. Kim, B. J. Kuh, and J. M. Park, "Ongoing Evolution of DRAM Scaling via Third Dimension-Vertically Stacked DRAM", in 2023 Symposium on VLSI Technology and Circuits Digest of Technical Papers, TFS1-1, pp. 1-2, June 2023). However, the aspect ratio of the capacitor of the DRAM cell is 50, which is large. Since the area of this capacitor is very large, when the DRAM cell is horizontally disposed, for example, as many as 200 layers are required to be laminated to obtain an equivalent area of an economical memory cell such as existing vertically disposed DRAM cell.

There also is a proposal of lamination of capacitorless DRAM cells each including a single MOS transistor (see U.S. Patent Application Publication No. 2023/0106561 A1). A problem arises with this structure in that, when an ON voltage is applied to the above-described selection word line, a floating body channel voltage of the selection memory cell continuous with this selection word line significantly fluctuates due to capacitive coupling between the gate electrode and the channel. Furthermore, as illustrated in FIG. 1F of U.S. Patent Application Publication No. 2023/0106561 A1, for example, a common floating body FB1 is controlled with two word lines WL0 and WL1. Thus, a problem of selectivity arises. As a countermeasure, a method in which, as illustrated in FIG. 1G, alternate word lines are grounded as shielded lines is indicated. However, there arises a problem with this method in that memory capacity is halved and the cost is doubled.

SUMMARY OF THE INVENTION

In a dynamic flash memory cell, realization of a memory cell having smaller substantial cell size is demanded.

To address the above-described problems, a memory device using a semiconductor element according to a first aspect of the present invention includes a first block in which a plurality of semiconductor memory cells including a first memory cell and a second memory cell are arranged in a matrix shape on a substrate. The first memory cell includes a first semiconductor base extending parallel to the substrate. The second memory cell includes a second semiconductor base separated from the first semiconductor base in a vertical direction or a horizontal direction and overlapping the first semiconductor base in plan view or in sectional view. The first block includes a first impurity region and a second impurity region respectively continuous with one end and another end of the first semiconductor base, a third impurity region and a fourth impurity region respectively continuous with one end and another end of the second semiconductor base, a first gate insulating layer surrounding the first semiconductor base, a second gate insulating layer surrounding the second semiconductor base, a first gate conductor layer and a second gate conductor layer respectively in contact with a first side surface of the first gate insulating layer and a first side surface of the second gate insulating layer, the first gate conductor layer and the second gate conductor layer being continuous with each other and being arranged side by side, and a third gate conductor layer in contact with a second side surface of the first gate insulating layer and a second side surface of the second gate insulating layer, the second side surface of the first gate insulating layer and the second side surface of the second gate insulating layer respectively being opposite from the first side surface of the first gate insulating layer and the first side surface of the second gate insulating layer. A data write operation is performed. The data write operation is configured to control voltages applied to the first to fourth impurity regions and the first to third gate conductor layers so as to cause part or an entirety of a positive hole group or an electron group serving as a major carrier to remain in the first semiconductor base and the second semiconductor base. The positive hole group or the electron group is generated by impact ionization due to a current flowed through the first semiconductor base and the second semiconductor base or generated by a gate induced drain leakage current. A data erase operation is performed. The data erase operation is configured to discharge the remaining positive hole group or the remaining electron group from one or both of the first impurity region and the second impurity region and one or both of the third impurity region and the fourth impurity region.

According to a second aspect of the present invention, in the above-described first aspect of the present invention, the first impurity region and the third impurity region are connected to a source line, the second impurity region is connected to a first bit line, and the fourth impurity region is connected to a second bit line. When one of the first gate conductor layer and the second gate conductor layer is connected to a selection gate line, another of the first gate conductor layer and the second gate conductor layer is connected to a plate line, and the third gate conductor layer is connected to a shielded line. Voltages applied to the source line, the first bit line, the second bit line, the plate line, the selection gate line, and the shielded line are controlled so as to perform the data erase operation, the data write operation, and a data read operation.

According to a third aspect of the present invention, in the above-described second aspect of the present invention, a ground voltage is applied to the shielded line in the data erase operation, the data write operation, and the data read operation.

According to a fourth aspect of the present invention, in the above-described third aspect of the present invention, the ground voltage is zero volts.

According to a fifth aspect of the present invention, in the above-described second aspect of the present invention, the first semiconductor base and the second semiconductor base overlap each other in sectional view of the substrate. The plate line, the selection gate line, and the shielded line are disposed parallel to the substrate in plan view.

According to a sixth aspect of the present invention, in the above-described second aspect of the present invention, the first bit line and the second bit line are perpendicular to the plate line, the selection gate line, and the shielded line in perpendicular sectional view relative to the substrate. The source line is disposed parallel to the plate line, the selection gate line, and the shielded line in plan view.

According to a seventh aspect of the present invention, in the above-described second aspect of the present invention, the first semiconductor base and the second semiconductor base overlap each other in plan view of the substrate. The plate line, the selection gate line, and the shielded line are disposed parallel to the substrate in sectional view.

According to an eighth aspect of the present invention, in the above-described second aspect of the present invention, the first bit line and the second bit line are perpendicular to the plate line, the selection gate line, and the shielded line in plan view of the substrate. The source line is disposed parallel to the plate line, the selection gate line, and the shielded line in sectional view of the substrate.

According to a ninth aspect of the present invention, the memory device according to the above-described first aspect of the present invention further includes a fourth gate conductor layer in contact with the first side surface of the first gate insulating layer and the first side surface of the second gate insulating layer. The fourth gate conductor layer, the first gate conductor layer, and the second gate conductor layer are arranged side by side.

According to a tenth aspect of the present invention, in the above-described ninth aspect of the present invention, the fourth gate conductor layer is connected to a second selection gate line.

According to an eleventh aspect of the present invention, in the above-described second aspect of the present invention, a channel length of the second gate conductor layer is longer than one or both of a channel length of the first gate conductor layer and a channel length of the third gate conductor layer.

According to a twelfth aspect of the present invention, in the above-described first aspect of the present invention, the third gate conductor layer includes the first gate conductor layer, a fifth gate conductor layer facing the second gate conductor layer, and a sixth gate conductor layer.

According to a thirteenth aspect of the present invention, the memory device according to the above-described first aspect of the present invention further includes a second block that overlaps the first block in plan view or in sectional view and that includes a third memory cell and a fourth memory cell.

DESCRIPTION OF THE PREFERRED EMBODIMENTS

Hereinafter, a structure and a driving method of a memory device using a semiconductor element (hereinafter, referred to as a dynamic flash memory) according to the present invention will be described with reference to the drawings.

First Embodiment

Figure 1A:
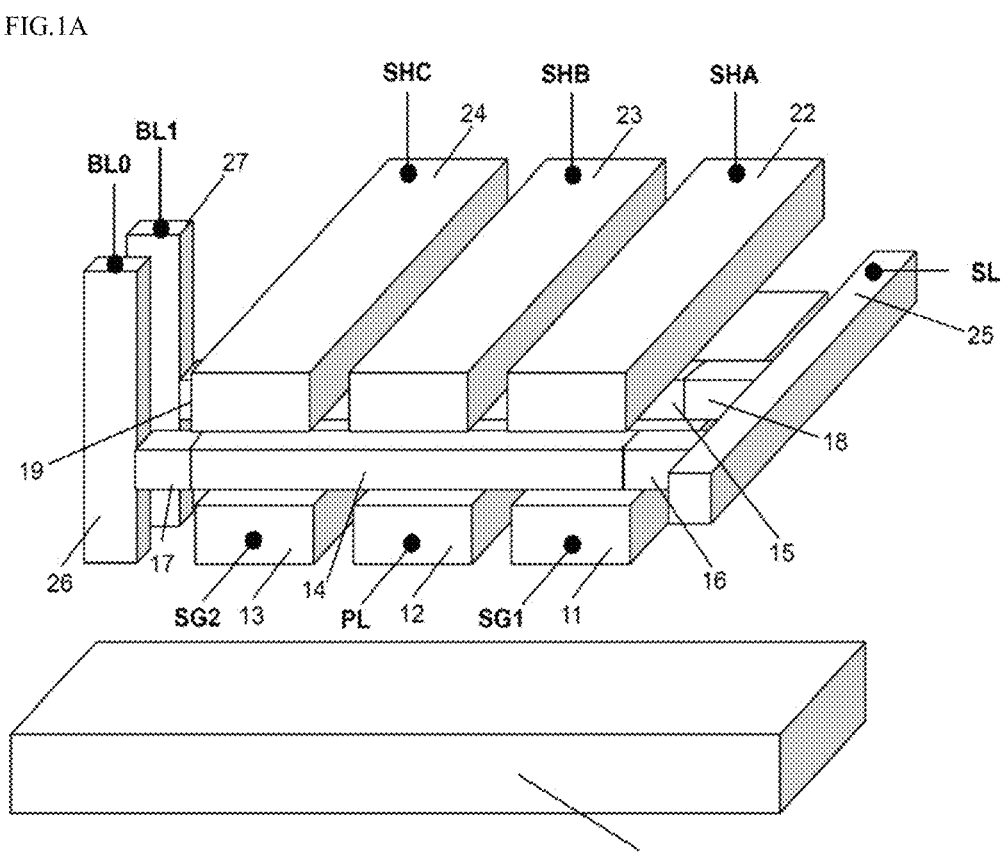
FIG. 1A illustrates a structure of memory cells according to a first embodiment.
Figure 1B:
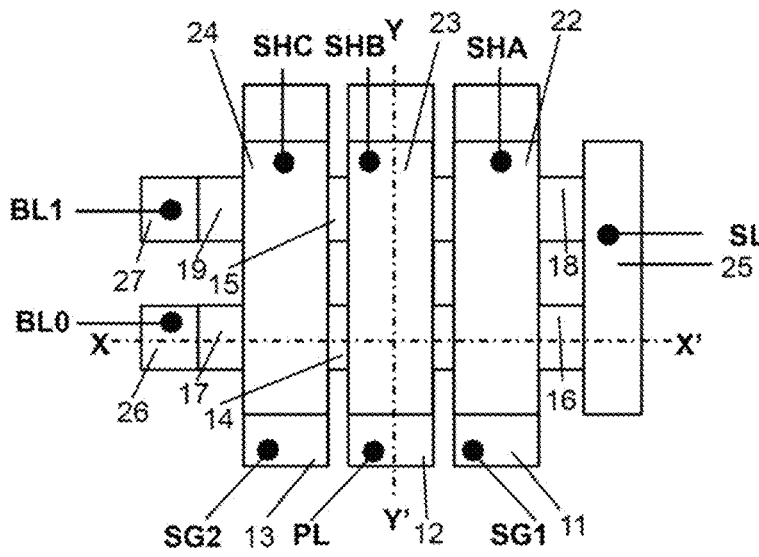
FIGS. 1BA, 1BB, and 1BC illustrate the structure of the memory cells according to the first embodiment.
Figure 1B:
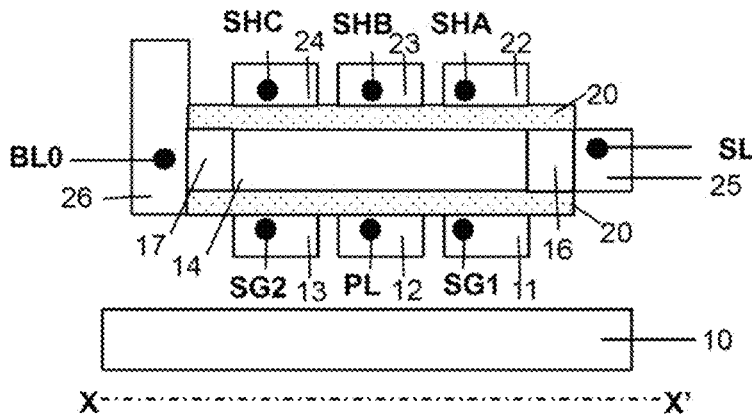
Figure 1B:
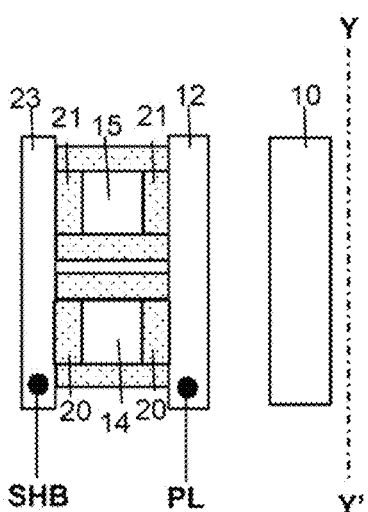
Figure 1C:
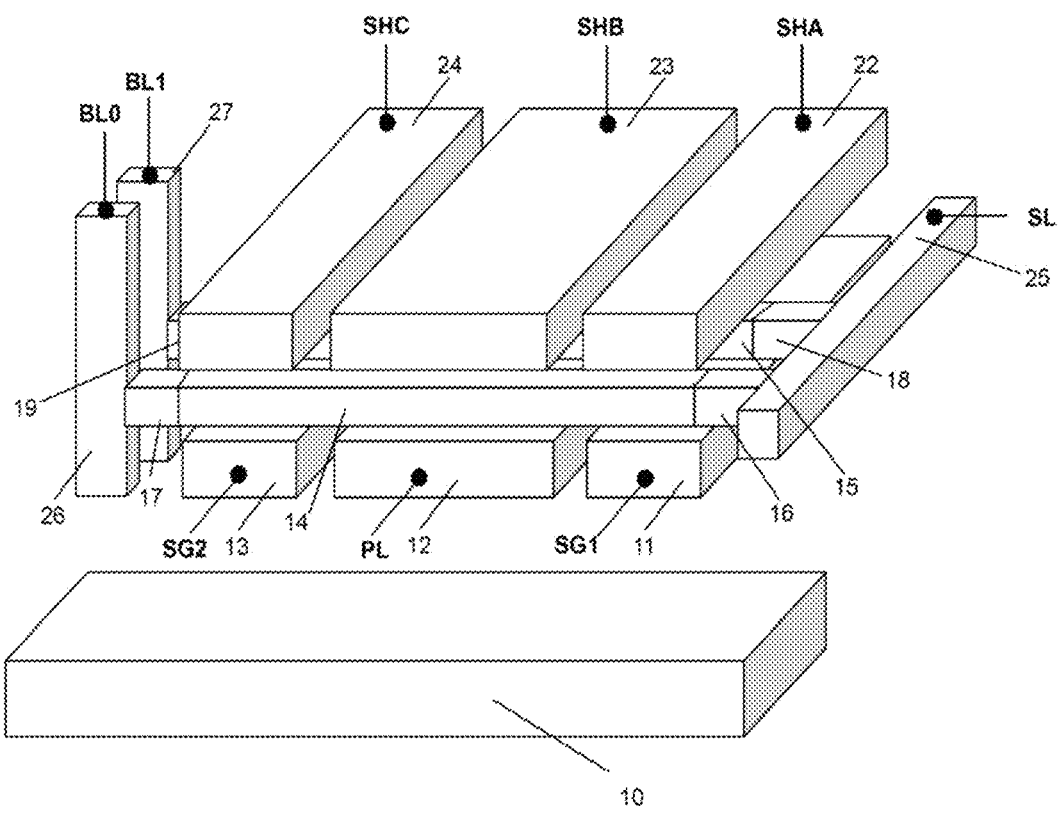
FIG. 1C illustrates a structure of the memory cells according to the first embodiment.
Figure 1D:
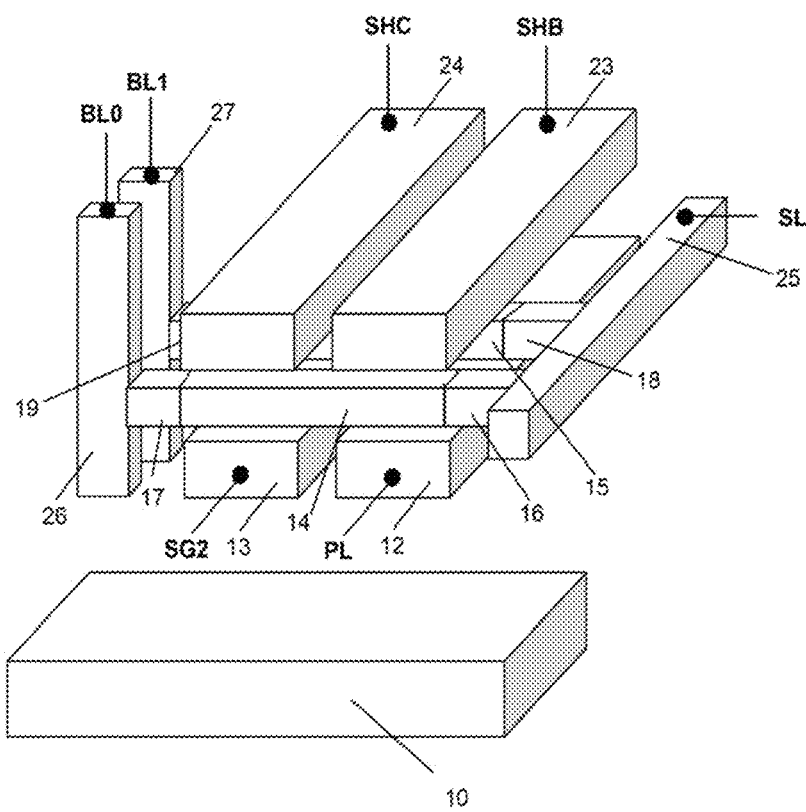
FIG. 1D illustrates a structure of the memory cells according to the first embodiment.
Figure 1E:
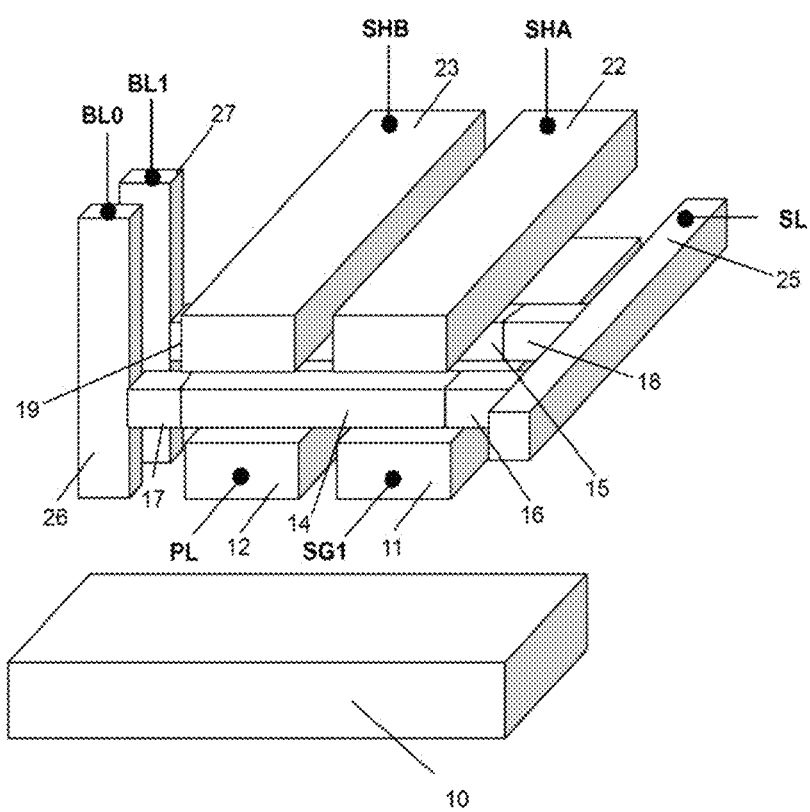
FIG. 1E illustrates a structure of the memory cells according to the first embodiment.
Figure 1F:
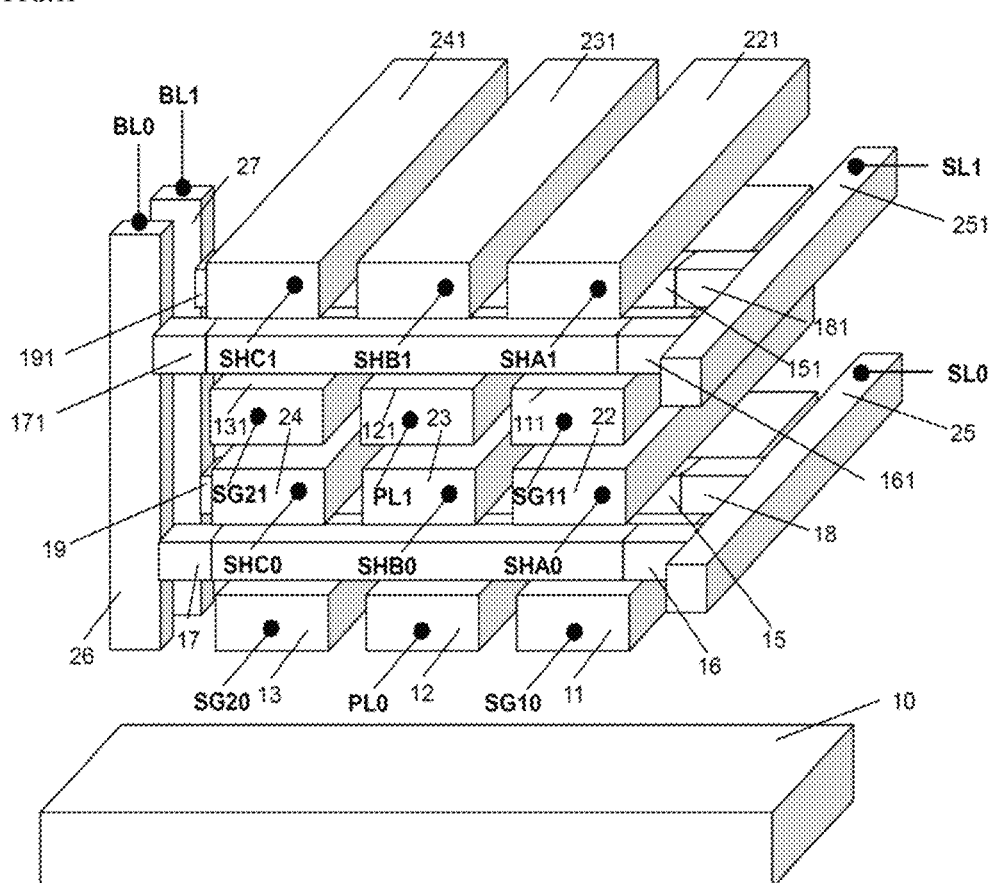
FIG. 1F illustrates a structure of the memory cells according to the first embodiment.
Figure 2A:
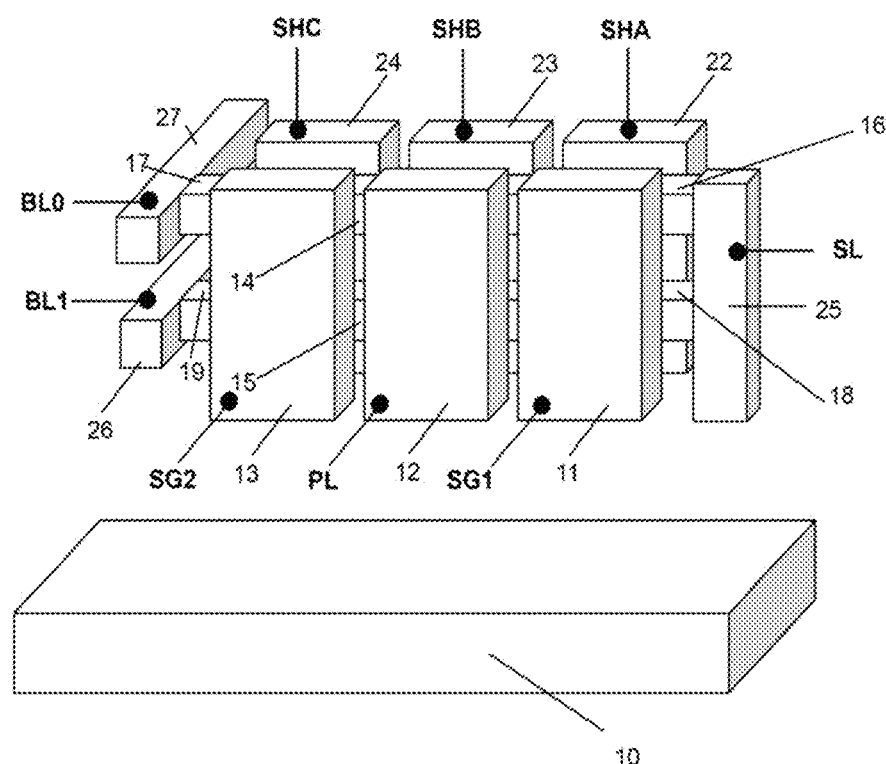
FIG. 2A illustrates a structure of memory cells according to a first embodiment.
Figure 2B:
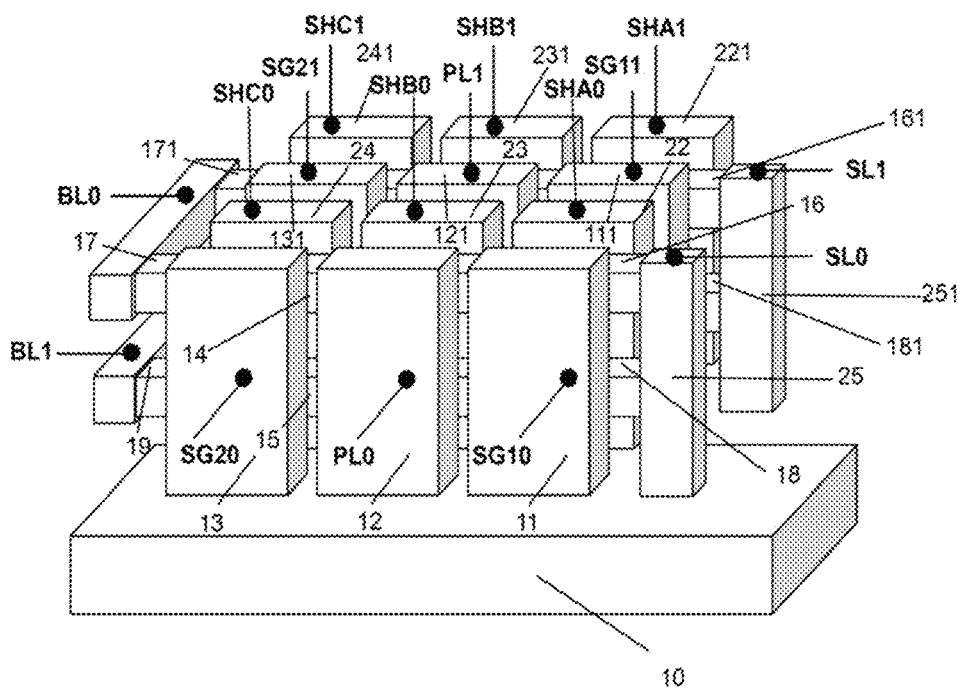
FIG. 2B illustrates a structure of memory cells according to the first embodiment.
Figure 3A:
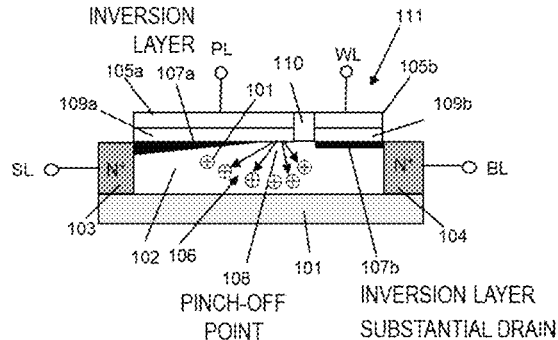
FIGS. 3A, 3B, 3C, and 3D illustrate a related-art capacitorless dynamic flash memory cell including a MOS transistor.
Figure 3B:
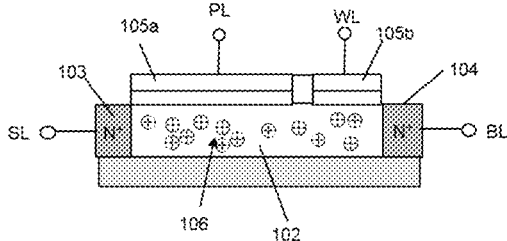
Figure 3C:
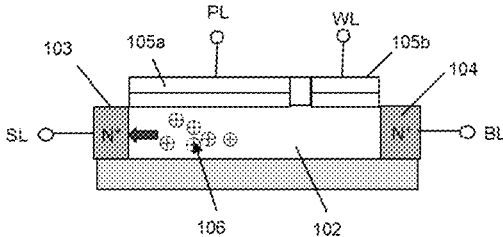
Figure 3D:
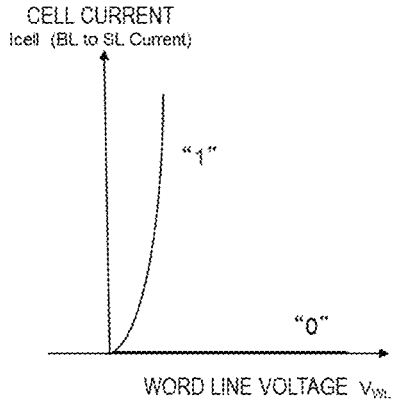
Figure 4:
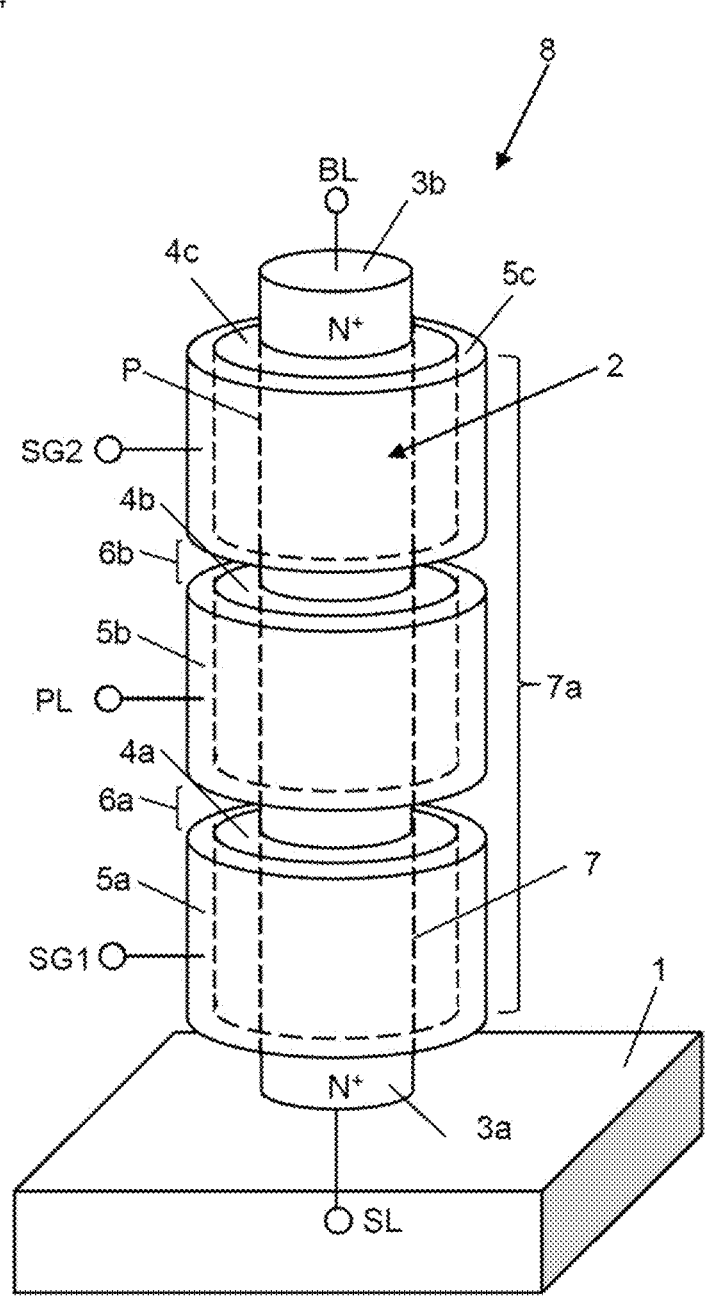
FIG. 4 illustrates a related-art capacitorless dynamic flash memory cell including a MOS transistor and three gates.

Referring to FIGS. 1A to 1F and FIGS. 2A and 2B, a structure, an operation mechanism, and a manufacturing method of dynamic flash memory cells according to a first embodiment of the present invention are described. Referring to FIGS. 1A, 1BA, 1BB, and 1BC, the following structure is described: bit lines are disposed perpendicular to a substrate; and first and second selection gate lines and a plate line are disposed parallel to the substrate. Referring to FIGS. 2A and 2B, the following structure is described: the bit lines are disposed parallel to the substrate; and the first and second selection gate lines and the plate line are disposed perpendicular to the substrate.

FIG. 1A illustrates a bird's-eye view of the structure of the dynamic flash memory cells according to the first embodiment of the present invention. FIG. 1BA illustrates a plan view of the structure of the dynamic flash memory cells according to the first embodiment of the present invention. FIG. 1BB illustrates a sectional view taken along line X-X' illustrated in FIG. 1BA. FIG. 1BC illustrates a sectional view taken along line Y-Y' illustrated in FIG. 1BA. A first semiconductor base 14 of a P layer (serving as an example of a "first semiconductor base" according to the present invention) is parallel to a substrate 10 (serving as an example of a "substrate" according to the present invention). U.S. Patent Application Publication No. US2022/0367681 A1 describes the structure in which the dynamic flash memory cells are provided parallel to the substrate 10. An N$^+$ layer 16 (serving as an example of a "first impurity region" according to the present invention) and an N$^+$ layer 17 (serving as an example of a "second impurity region" according to the present invention) are respectively provided at one end and the other end of the first semiconductor base 14. A second semiconductor base 15 of the P layer (serving as an example of a "second semiconductor base" according to the present invention), an N$^+$ layer 18 (serving as an example of a "third impurity region" according to the present invention), and an N$^+$ layer 19 (serving as an example of a "fourth impurity region" according to the present invention) are provided on a back side of the first semiconductor base 14. A first gate insulating layer 20 (serving as an example of a "first gate insulating layer"

according to the present invention) and a second gate insulating layer 21 (serving as an example of a "second gate insulating layer" according to the present invention) are respectively formed around the first semiconductor base 14 and the second semiconductor base 15.

A first gate conductor layer 11 (serving as an example of a "first gate conductor layer" according to the present invention), a second gate conductor layer 12 (serving as an example of a "second gate conductor layer" according to the present invention), and a fourth gate conductor layer 13, which are isolated from each other, are in contact with a first side surface of each of the first gate insulating layer 20 and the second gate insulating layer 21 (serving as an example of a "first side surface" according to the present invention). Third gate conductor layers 22, 23, and 24 (serving as examples of a "third gate conductor layer" according to the present invention) are provided so as to be in contact with a second side surface (serving as a "second side surface" according to the present invention) opposite from the first side surface of each of the first gate insulating layer 20 and the second gate insulating layer 21. The third gate conductor layers 22, 23, and 24 serve as common gates to the first semiconductor base 14 and the second semiconductor base 15. Although FIGS. 1A to 1F, 2A, and 2B illustrate the third gate conductor layer as the trisected third gate conductor layers, a single gate conductor layer may be used instead. Although it will be described later, as illustrated in FIG. 1D, the first gate conductor layer 11 is not necessarily provided. Although it will also be described later, as illustrated in FIG. 1E, the fourth gate conductor layer 13 is not necessarily provided.

The first impurity region 16 and the third impurity region 18 are connected to SL serving as a source line 25 (serving as an example of a "source line" according to the present invention), the second impurity region 17 is connected to BL0 serving as a first bit line 26 (serving as an example of a "first bit line" according to the present invention), and the fourth impurity region 19 is connected to BL1 serving as a second bit line 27 (serving as an example of a "second bit line" according to the present invention). The first gate conductor layer 11 is connected to a first selection gate line SG1 (serving as an example of a "selection gate line" according to the present invention), the second gate conductor layer 12 is connected to a plate line PL (serving as an example of a "plate line" according to the present invention), the fourth gate conductor layer 13 is connected to a second selection gate line SG2, and the third gate conductor layers 22, 23, and 24 are connected to shielded lines SHA, SHB, and SHC (serving as examples of a "shielded line" according to the present invention).

Six terminals of a first memory cell (serving as an example of a "first memory cell" according to the present invention) include the first selection gate line SG1, the plate line PL, the second selection gate line SG2, the shielded lines SHA, SHB, and SHC, the source line SL, and the first bit line BL0. Six terminals of a second memory cell (serving as an example of a "second memory cell" according to the present invention) include the first selection gate line SG1, the plate line PL, the second selection gate line SG2, the shielded lines SHA, SHB, and SHC, the source line SL, and the second bit line BL1. The first memory cell and the second memory cell are included in part of a first block (serving as an example of a "first block" according to the present invention).

For example, when the first block is selected, voltages applied to the source line SL, the first bit line BL0, the second bit line BL1, the plate line PL, the first selection gate line SG1, the second selection gate line SG2, and the shielded lines SHA, SHB, and SHC are controlled so as to perform a data erase operation, a data write operation, and a data read operation on the first memory cell and the second memory cell. In these three operation modes, a voltage of zero volts being a ground voltage is applied to the shielded lines SHA, SHB, and SHC. In dynamic flash memory cells of a dual gate structure in which facing surfaces of a silicon thin film are controlled with two gates as described above, when one of the gates is set to the ground voltage, a positive hole group of a "1" write state can be stably held.

Furthermore, in the dynamic flash memory cells of the dual gate structure, when one of the gates is set to the ground voltage, the thickness of the silicon film of a floating body can be reduced. Thus, even when a plurality of the memory cells are laminated, the aspect ratio of the lamination can be reduced. This enables lamination of more memory cells, and the further cost reduction can be realized.

FIG. 1C illustrates an example in which a channel length (lengths in the line X-X' direction) of the plate line PL is set to be longer than channel lengths of the first selection gate line SG1 and the second selection gate line SG2. In this way, a good controllability of a plate line voltage is obtained for the floating bodies of the memory cells. Furthermore, depending on the channel length (gate length) of the plate line, more positive holes can be held in the floating body in the "1" write state.

FIG. 1D illustrates an example in which the first selection gate line SG1 adjacent to the source line SL is removed. FIG. 1E illustrates an example in which the second selection gate line SG2 adjacent to the bit lines BL0 and BL1 is removed. In this way, a cell size of the dynamic flash memory cell can be further miniaturized. Furthermore, a cell current can be increased, and the speed can be further increased. Although there is a drawback of reducing a data retention capability due to removal of one of the selection gates, the good controllability of the plate line voltage is obtained for the floating bodies of the memory cells. Furthermore, depending on the gate length of the plate line, more positive holes can be held in the floating body in the "1" write state. This is a matter of selection in the design for an application using the dynamic flash memory cells.

FIG. 1F illustrates an example in which two dynamic flash memory cells are laminated. Shielded lines SHA0, SHB0, and SHC0 shield the memory cell of the first block. Shielded lines SHA1, SHB1, and SHC1 shield the memory cell of the second block.

FIG. 2A illustrates an example in which the first selection gate line SG1, the plate line PL, the second selection gate line SG2, and the source line SL are disposed perpendicular to the substrate 10, and the first bit line BL0 and the second bit line BL1 are disposed parallel to the substrate 10. That is, the dynamic flash memory cells correspond to dynamic flash memory cells obtained by rotating the dynamic flash memory cells illustrated in FIGS. 1A to 1F toward the rear direction of FIGS. 1A to 1F by 90 degrees relative to the substrate 10. Although this is a matter of selection in the design for an application using the dynamic flash memory cells, main features are similar to those of the dynamic flash memory cells illustrated in FIGS. 1A to 1F.

FIG. 2B illustrates an example in which, similarly to the case illustrated in FIG. 1F, two dynamic flash memory cells are laminated in the parallel direction relative to the substrate 10.

The dynamic flash memory cells illustrated in FIGS. 1A to 1F, 2A, and 2B have been described using the shapes in which the configurational items have rectangular vertical sections. However, these vertical sectional shapes may be other shapes such as, for example, trapezoidal shapes. Furthermore, the different elements may have different vertical sections. This is applied to the other embodiments in the same manner.

Furthermore, also in a structure in which the conductivities of the semiconductor bases of the N⁺ layers 16, 17, 18, and 19 and the P layers 14 and 15 of the dynamic flash memory cells illustrated in FIGS. 1A and 1B are reversed, the operations of the dynamic flash memory are performed. In this case, in the semiconductor base of the N type, the majority carrier is electrons. Accordingly, an electron group generated due to impact ionization is stored in the floating body, and a "1" state is set.

Furthermore, a junctionless structure may be used. In the junctionless structure, the conductivities of the semiconductor bases of the N⁺ layers 16, 17, 18, and 19 and the P layers 14 and 15 of the dynamic flash memory cells illustrated in FIGS. 1A and 1B are the same. This is applied to the other embodiments in the same manner.

The present embodiment has the following features.

Feature 1

In the dynamic flash memory cells according to the embodiment of the present invention, as illustrated in FIGS. 1A and 1B, the fourth gate conductor layers 22, 23, and 24 have roles of shielded gates. For example, when the ground voltage is applied to the fourth gate conductor layers 22, 23, and 24, the potentials of the semiconductor bases 14 and 15, which serve as the floating bodies, during driving can be stabilized. Thus, the thickness of films of the semiconductor bases 14 and 15 of the floating bodies can be reduced. This reduces the aspect ratio of the plurality of laminated memory cells. Thus, the number of the memory cells able to be laminated can be further increased, and the reduction of the cost can be realized. This is applied to the memory cells illustrated in FIGS. 1C to 2B in the same manner.

Feature 2

Regarding the lamination of the memory cells, the memory cell is laminated at a line-symmetric folded position about the shielded line as the central axis. Thus, it is not necessary to duplicate the gate material of the shielded line. Consequently, the aspect ratio of the laminated memory can be reduced without halving the memory capacity, and accordingly, a further increase in capacity can be realized. Furthermore, processing steps can be simplified, and a memory device can be provided at lower price.

OTHER EMBODIMENTS

The gate conductor layer continuous with the plate line may be a single layer or a combination of a plurality of conductor material layers. Likewise, the gate conductor layer continuous with the first and second selection gate lines may be a single layer or a combination of a plurality of conductor material layers. Furthermore, an outer side of the gate conductor layer may be continuous with a wiring metal layer of, for example, W or the like. This is similarly applied to the other embodiments according to the present invention.

Furthermore, as the voltage of the plate line PL in the description of the embodiment, for example, a fixed voltage of 0 V may be applied regardless of the operation modes. As the voltage of the plate line PL, a fixed voltage or a time-varying voltage may be applied as long as the voltage to be applied satisfies the conditions under which the operations of the dynamic flash memory can be performed.

Furthermore, referring to FIGS. 1A to 1F, an N-type or P-type impurity region may be provided between the first impurity region N⁺ layer 16 and/or the second impurity region N⁺ layer 17 and the first semiconductor base P layer 14. This is similarly applied to the other embodiments according to the present invention.

In addition, various embodiments and modifications of the present invention can be made without departing from the broad spirit and scope of the present invention. Each of the embodiments described above is for describing an example of the present invention and does not limit the scope of the present invention. The above-described examples and modifications can be arbitrarily combined with each other. Furthermore, embodiments from which a subset of constituent features of the embodiments are removed according to necessity also fall within the technical idea of the present invention.

With the memory device using the semiconductor element according to the present invention, high-density high-performance dynamic flash memory can be obtained.

What is claimed is:

1. A memory device using a semiconductor element, the memory device comprising:
   a first block in which a plurality of semiconductor memory cells including a first memory cell and a second memory cell are arranged in a matrix shape on a substrate,
   wherein the first memory cell includes a first semiconductor base extending parallel to the substrate,
   wherein the second memory cell includes a second semiconductor base separated from the first semiconductor base in a vertical direction or a horizontal direction and overlapping the first semiconductor base in plan view or in sectional view,
   wherein the first block includes
   a first impurity region and a second impurity region respectively continuous with one end and another end of the first semiconductor base,
   a third impurity region and a fourth impurity region respectively continuous with one end and another end of the second semiconductor base,
   a first gate insulating layer surrounding the first semiconductor base,
   a second gate insulating layer surrounding the second semiconductor base,
   a first gate conductor layer and a second gate conductor layer respectively in contact with a first side surface of the first gate insulating layer and a first side surface of the second gate insulating layer, the first gate conductor layer and the second gate conductor layer being continuous with each other and being arranged side by side, and
   a third gate conductor layer in contact with a second side surface of the first gate insulating layer and a second side surface of the second gate insulating layer, the second side surface of the first gate insulating layer and the second side surface of the second gate insulating layer respectively being opposite from the first side surface of the first gate insulating layer and the first side surface of the second gate insulating layer.

2. The memory device according to claim 1, wherein the first impurity region and the third impurity region are connected to a source line, the second impurity region is connected to a first bit line, and the fourth impurity region is connected to a second bit line, wherein, when one of the first gate conductor layer and the second gate conductor layer is connected to a selection gate line, another of the first gate conductor layer and the second gate conductor layer is connected to a plate line, and the third gate conductor layer is connected to a shielded line, and wherein voltages applied to the source line, the first bit line, the second bit line, the plate line, the selection gate line, and the shielded line are controlled so as to perform a data erase operation, a data write operation, and a data read operation.

3. The memory device according to claim 2, wherein a ground voltage is applied to the shielded line in the data erase operation, the data write operation, and the data read operation.

4. The memory device according to claim 3, wherein the ground voltage is zero volts.

5. The memory device according to claim 2, wherein the first semiconductor base and the second semiconductor base overlap each other in sectional view of the substrate, and wherein the plate line, the selection gate line, and the shielded line are disposed parallel to the substrate in plan view.

6. The memory device according to claim 2, wherein the first bit line and the second bit line are perpendicular to the plate line, the selection gate line, and the shielded line in perpendicular sectional view relative to the substrate, and wherein the source line is disposed parallel to the plate line, the selection gate line, and the shielded line in plan view.

7. The memory device according to claim 2, wherein the first semiconductor base and the second semiconductor base overlap each other in plan view of the substrate, and wherein the plate line, the selection gate line, and the shielded line are disposed parallel to the substrate in sectional view.

8. The memory device according to claim 2, wherein the first bit line and the second bit line are perpendicular to the plate line, the selection gate line, and the shielded line in plan view of the substrate, and wherein the source line is disposed parallel to the plate line, the selection gate line, and the shielded line in sectional view of the substrate.

9. The memory device according to claim 1, further comprising:

a fourth gate conductor layer in contact with the first side surface of the first gate insulating layer and the first side surface of the second gate insulating layer, the fourth gate conductor layer, the first gate conductor layer, and the second gate conductor layer being arranged side by side.

10. The memory device according to claim 9, wherein the fourth gate conductor layer is connected to a second selection gate line.

11. The memory device according to claim 2, wherein a channel length of the second gate conductor layer is longer than one or both of a channel length of the first gate conductor layer and a channel length of the third gate conductor layer.

12. The memory device according to claim 1, wherein the third gate conductor layer includes the first gate conductor layer, a fifth gate conductor layer facing the second gate conductor layer, and a sixth gate conductor layer.

13. The memory device according to claim 1, further comprising:

a second block that overlaps the first block in plan view or in sectional view and that includes a third memory cell and a fourth memory cell.

14. The memory device according to claim 1, wherein a data write operation is performed, the data write operation being configured to control voltages applied to the first to fourth impurity regions and the first to third gate conductor layers so as to cause part or an entirety of a positive hole group or an electron group serving as a major carrier to remain in the first semiconductor base and the second semiconductor base, the positive hole group or the electron group being generated by impact ionization due to a current flowed through the first semiconductor base and the second semiconductor base or generated by a gate induced drain leakage current, and a data erase operation is performed, the data erase operation being configured to discharge the remaining positive hole group or the remaining electron group from one or both of the first impurity region and the second impurity region and one or both of the third impurity region and the fourth impurity region.

\* \* \* \* \*